(12) United States Patent
Suemasu et al.

(10) Patent No.: US 6,743,499 B2
(45) Date of Patent: Jun. 1, 2004

(54) METAL FILLING METHOD AND MEMBER WITH FILLED METAL SECTIONS

(75) Inventors: Tatsuo Suemasu, Tokyo (JP); Takashi Takizawa, Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 10/247,264

(22) Filed: Sep. 19, 2002

(65) Prior Publication Data

US 2003/0082356 A1 May 1, 2003

(30) Foreign Application Priority Data

Sep. 20, 2001 (JP) .......................................... 2001-287082
Sep. 17, 2002 (JP) .......................................... 2002-270563

(51) Int. Cl.[7] .............................................. B32B 15/00

(52) U.S. Cl. ........................ 428/209; 428/201; 428/457; 428/689; 428/901

(58) Field of Search ................................. 428/209, 201, 428/457, 689, 901

(56) References Cited

U.S. PATENT DOCUMENTS 6,453,549 B1 * 9/2002 Bhatt et al. .................... 29/837

* cited by examiner

Primary Examiner—Deborah Jones
Assistant Examiner—Ling Xu
(74) Attorney, Agent, or Firm—Hoffmann & Baron, LLP

(57) ABSTRACT

In the formation of through wirings in a silicon substrate and so forth, there was a need for the development of a technology that would allow metal to be reliably filled particularly in the vicinity of openings of through holes and other fine holes. This invention provides a metal filling method and member with filled metal sections in which, in the inflow and filling of a plating solution into through holes 11 of a substrate 10 by immersing said substrate 10 in heated and melted conductive metal, filled metal sections are formed by preliminarily forming a metal layer 15 on the inner surface of one of the ends of through holes 11 of this substrate 10 as well as on substrate top surface 13 around those openings, removing substrate 10 on which inflow and filling of the plating solution into through holes 11 has been completed from the plating solution, and then cooling to solidify the plating solution that has been filled into the through holes.

3 Claims, 10 Drawing Sheets

METAL FILLING METHOD AND MEMBER WITH FILLED METAL SECTIONS

This application claims priority to Japanese Patent Application Nos. 2001-287082 filed on Sep. 20, 2001 and 2002-270563 filed on Sep. 17, 2002.

BACKGROUND ART

The present invention relates to a metal filling method and member with filled metal sections in which a metal is filled into fine holes formed in a member, such as through holes or non-through holes formed in a circuit substrate.

For example, in the case of forming through hole electrodes (via hole electrodes) in a substrate (such as a silicon substrate) in the production process of an IC chip and so forth, a plating method is typically used in which through holes for the through hole electrodes are opened in the substrate, the substrate is inserted into a plating solution (molten metal) in which a conductive metal has been solved, and immersed in that the plating solution to fill the into the conductive metal through holes.

However, in the case of filling metal into through holes by the plating method, there are cases in which, for some reason, the plating layer concentrically grow near the through hole entrance of the substrate, thereby making it difficult for plating liquid to enter to the back of the through holes. In this case, there are problems such as the occurrence of roughness within the through holes that made it difficult to fill metal in a state free of voids.

In cases in which the through holes are fine holes having a high aspect ratio (depth of the hole/opening diameter of the hole) in particular, since it is difficult for the plating solution to penetrate to the back of the through holes, concentrated growth of the plating layer near the through hole entrance of the substrate occurs easily, causing the problems described above to become remarkable. For example, in the case of high-density, three-dimensional mounting consisting of the stacking of silicon IC chips and so forth, although there are cases in which through electrodes (through wirings) are formed in the substrate for connecting the wiring patterns on the top and bottom of a substrate, since the through holes for through electrodes opened in the substrate are fine holes having a high aspect ratio, if through electrodes are attempted to be formed by filling metal into the through holes using the plating method described above, it is difficult to reliably form through electrodes that are free of voids.

SUMMARY OF THE INVENTION

In consideration of the above problems, the object of the present invention is to provide a metal filling method and member with filled metal sections that allows filling of a plating solution to be carried out reliably particularly near openings that open on the outer surface of a work piece of fine holes formed in that work piece.

The metal filling method according to the present invention is a method for filling metal into fine holes formed in a work piece, and is characterized by forming a metal layer on the inner surface of an end of each fine hole that opens in an outer surface of the work piece, followed by immersing the work piece in the plating solution, filling the plating solution into the fine holes, removing the work piece from the plating solution with one of ends along an axial direction of each fine hole still occluded, and then cooling the work piece.

In this metal filling method, a constitution can also be employed in which the fine holes are through holes that pass through the work piece, the metal layer is formed on the inner surface of at least one end of both ends in the axial direction of each through hole, and when the work piece, which has been immersed in the plating solution to fill the plating solution into the through holes, is removed from the plating solution, an opening in the other end of the axial direction of each through holes is occluded with a sealing material as the above one of ends along the axial direction of each fine hole. Moreover, the metal layer can be formed on the inner surface of the end of the fine hole that opens in the outer surface of the work piece as well as on the outer surface of the work piece extending around the end of the fine hole on which the metal layer is formed. In this case, after immersing this work piece in the plating solution within a plating solution bath to fill the plating solution into the fine hole but prior to cooling of the work piece, the plating solution filled into the fine hole is padded at the sites where the metal layer was formed on the inner surface of the end of the fine hole that opens on the outer surface of the work piece and on the outer surface of the work piece extending around the end of the fine hole on the work piece which is removed from the plating solution. And then, a filled metal section formed by solidification of the plating solution within the fine holes, and an external metal section formed by solidification of the padded sections of the plating solution, are formed unitarily by cooling said work piece.

In addition, in the metal filling method as claimed in the present invention, the metal layer around the openings of fine holes in the outer surface of a work piece can also be patterned corresponding to the shape of the external metal sections to be formed prior to immersing the work piece in the plating solution.

The member with filled metal sections according to the present invention is a member with filled metal sections having filled metal sections formed by filling a metal into fine holes formed in a work piece, and is characterized by a metal layer being formed on the inner surface of an end of the above fine holes that opens to the outer surface of the work piece, and the filled metal sections being filled at a site that includes the end of the fine holes on which the above metal layer is formed. A constitution can also be employed for this member with filled metal sections in which a metal layer is formed not only on the inner surface of the end of the fine holes that opens in the outer surface of the work piece, but also on the outer surface of the work piece that extends around the end of the fine holes on which the metal layer is formed, and external metal sections, which are unitarily formed with the filled metal sections, and padded so as to protrude from the outer surface of the work piece, are formed so as to cover the metal layer.

The work piece as claimed in this invention is a member having fine holes for metal filling that are either through holes (fine holes) or non-through holes (fine holes in which only one end in the axial direction open on the outer surface of the work piece, while the other end are not open), examples of which include a substrate (circuit substrate) in which via holes or so-called inner via holes are formed. In addition to semiconductor materials such as silicon or gallium arsenide (GaAs), various other materials such as glass or other insulating material can be used for the material of the work piece.

Examples of methods for forming fine holes (through holes or non-through holes) in the work piece as claimed in the present invention include Deep-Reactive Etching (DRIE) as is represented by Inductively Coupled Plasma-Reactive Ion Etching (ICP-RIE), wet etching methods using an etching solution, mechanical processing methods using a microdrill, and optical excitation electrolytic polishing. Fine hole diameter, work piece dimensions, fine hole depth and so forth are suitably set according to the application and so forth, and the cross-sectional shape of the fine holes (shape of the cross-section perpendicular to the axial direction) may be of any shape such as circular, oval, triangular or rectangular (including a square).

In the metal filling method as claimed in the present invention, a technique is employed in which, after immersing a work piece in a plating solution which is composed of heated and melted conductive metal and filling this plating solution into the fine holes by allowing a plating solution to flow into the fine holes, the work piece is removed from the plating solution with one of the ends in the axial direction of the above fine holes still occluded, after which the work piece is cooled to solidify the plating solution in the fine holes. In the case the fine holes are through holes, through wirings and so forth can be formed by solidifying the plating solution that has been filled into the fine holes of the work piece, and in the case the fine holes are non-through holes, internal electrodes, internal wirings and so forth can be formed in the form of filled metal sections by the solidified conductive metal.

Furthermore, when removing the work piece from the plating solution, having one of the ends in the axial direction of the fine holes still occluded can be realized by covering one of the ends along the axial direction of each through hole using a sealing material in the case the fine holes are through holes. In addition, in the case the fine holes are non-through holes, since the constitution of the non-through hole itself is such that one end along the axial direction is open while the other end is blocked, it goes without saying that the use of a sealing material is not required.

In the metal filling method as claimed in the present invention, since the heated and melted conductive metal is filled into fine holes, defective filling caused by concentrated growth of the plating layer at the entrance of fine holes in the case of a plating method (including the formation of voids as previously described) can be avoided. In the present invention, "plating solution" refers to this heated and melted conductive metal.

In the present invention, immersion of the work piece into the plating solution refers to submerging the work piece in the plating solution, or in other words, the work piece is inserted into the plating solution. However, the immersion referred to here is not limited to the immersion of the work piece into the plating solution stored in a bath (to also be referred to as a plating solution bath), but also includes the injection of the plating solution into a container that houses the work piece (including the above plating solution bath). Here, "filling" into fine holes is not limited to filling entire fine pores without voids, and a constitution in which, for example, voids are left in a portion of the fine holes in the axial direction (case of filling metal into inner via holes or other non-through holes) or a slight amount of space is present in the filled metal, is also included. In the present invention, as a result of being able to reliably fill metal near the entrance of the openings of the fine holes in particular, the electrical and mechanical properties of the filled metal sections can be adequately secured. In addition, "removal" of the work piece from the plating solution includes lifting up the work piece from out of the plating solution retained in a bath, removing the work piece in the horizontal direction, and exposing a work piece that has been immersed in the plating solution in a bath by discharging the plating solution from inside the bath.

However, as a result of the inventors of the present invention verifying the filled status of the plating solution within fine holes after removing a work piece in the form of a substrate formed from silicon and glass from the plating solution, merely a method is used in which a work piece in which the plating solution has flown into and filled fine holes is simply lifted out (equivalent to "removed") from the plating solution with the closed side among both ends in the axial direction of each fine hole is the lower end, it was found that, as a result of it being easy for the plating solution to flow out from the opening of each fine holes that opens on the upper surface during removal of the work piece, and the plating solution flowing out during removal, there are many cases in which there is insufficient filling of the plating solution during cooling and solidification. Since the amount of the plating solution contained in the fine holes decreases if outflow of the plating solution occurs, as shown in FIG. 15, for example, the upper surface of the plating solution 2 within each fine hole 1 (through holes are shown in FIG. 15) ends up being slightly lower than the upper surface 4 of work piece 3 (a substrate in FIG. 15), resulting in the formation of level difference D. In addition, if this level difference is formed as shown in FIG. 15, even if, for example, bumps are attempted to be formed and bonded in a separate step on through wirings in which the plating solution has solidified, there is susceptibility to the occurrence of bonding defects between the bumps and through wirings, which can easily become a cause of defects such as incomplete electrical connections.

The phenomenon in which the plating solution flows out from the fine holes during removal of the work piece from the plating solution is caused by being unable to ensure adequate wettability with the plating solution in the case of using silicon and glass to form the work piece. That is, since there is a lack of acclimation between the inner surfaces of the fine holes and the plating solution, outflow of the plating solution from the fine holes occurs easily.

In the present invention, wettability with the plating solution that has been filled into fine holes is ensured by a metal layer formed on the inner surface of the end of each fine hole that is an upper end when the work piece is removed (by being lifted out and so forth) from the plating solution. As a result, when the work piece is removed from the plating solution, it is difficult for the plating solution to flow out from the openings of the fine holes, thereby being able to prevent problems such as the formation of a level difference near the openings of the fine holes. The metal layer is preferably formed over as a broad range as possible on the inner surface near the entrance of each fine hole. In the case the fine holes are through holes, if a metal layer is formed on the inner surface of both ends of each through hole, even if the metal layer is not formed over the entire inner surface along the lengthwise direction in the axial direction of the through hole, the plating solution is effectively acclimated throughout the entire through hole, thereby being effective in preventing the formation of voids and so forth within the through hole.

If a metal layer is formed on the inner surface of the end of each fine hole that opens to the outer surface of the work piece, as well as on the outer surface of the work piece that extends around the end of the fine hole, the outflow of the plating solution from the fine holes when the substrate is removed from the plating solution can be more reliably prevented due to the wettability of the plating solution with respect to the metal layer surrounding the openings. In addition, when the work piece is removed from the plating solution, by taking advantage of the formation of a layer of the conductive metal along this metal layer (metal layer around the openings), grounded sections, bumps and other external metal sections of the wiring can be formed on the substrate by cooling and solidifying the plating solution on this metal layer. Here, grounded sections, bumps and other external metal sections that are formed refer to those for which the plating solution is cooled and solidified after having been padded at those sites where the metal layer formed around the openings of the fine hole is present, and are unitarily formed with the filled metal sections that are solidified within the fine hole. Since the grounded sections, bumps and other external metal sections that are formed are continuous with the filled metal sections by the same type of metal as the filled metal sections, in comparison with the case of forming separately from the filled metal sections, there is the advantage of the absence of problems such as defective bonding with the filled metal sections. In addition, there are also no problems such as brittleness of the bonded sections (bonded sections between external metal sections and filled metal sections) caused by differences in the coefficients of thermal expansion or diffusion of materials and so forth that occur in the case the external metal sections and filled metal sections are of different types of materials.

For example, in the case of forming external metal sections in the form of bumps on the work piece in the form of the substrate, the size, shape and so forth can be adjusted according to the range of formation and so forth of the metal layer around the opening of each fine hole on one side of the substrate. When the substrate is removed from the plating solution, since the plating solution that remains at the sites where the metal layer is present that is formed at the opening of each fine hole and around the openings on one side of the substrate can be padded in a peak-shape due to its surface tension and so forth, a peak-shaped bump can be obtained by solidifying the plating solution. Thus, the height, size and so forth of bumps can be adjusted by adjusting the formation range of the metal layer around the openings of fine holes on one side of the substrate by patterning or other means.

In the member with filled metal sections as claimed in the present invention, since superior adherence is ensured between a metal layer and a filled metal section which is filled into the end of each fine hole on which a metal layer is formed due to the wettability of the metal layer formed on the inside of the end of fine hole that opens to the outer surface of the work piece, the fixed state of the filled metal section near the end of the fine hole can be maintained with stability over a long period of time, and since peeling of the filled metal section from the inner surface of the fine hole and lifting of the filled metal section within the fine hole can be reliably prevented, long-term stability is obtained.

Moreover, in a constitution in which an external metal section unitarily formed with the above filled metal section and padded so as to protrude beyond the outer surface of the work piece is formed so as to cover the metal layer which is formed on the outer surface of the work piece and extends around the end of the fine hole on which the metal layer is formed, since the filled metal section within the fine hole and the external metal section can be formed unitarily, there is no occurrence of problems such as defective bonding due to bonding of different types of metals or brittleness of bonded sections caused by difference in the coefficients of thermal expansion, diffusion of materials, etc.

According to the present invention, wettability with the plating solution filled into fine holes is ensured by the metal layer formed on the inner surface of the end that opens to the outer surface of a work piece among both ends of each fine hole. As a result, when a substrate is removed from the plating solution, it is difficult for the plating solution to flow out from the opening of the fine hole, and problems can be prevented such as the formation of a level difference near the opening of the fine hole. If this level difference is eliminated, bonding can be carried out reliably in the case of bonding bumps and so forth formed in a separate step to filled metal sections of through wirings and so forth in which this plating solution has solidified, thereby allowing bonding defects to be prevented. In addition, if a metal layer is formed on the inner surface of the end of the fine hole that opens to the outer surface of a work piece, the formation of voids inside the fine hole (and especially voids that form easily near the occluded end when the work piece is immersed in the plating solution) can be effectively prevented, thereby enabling the plating solution to be reliably filled throughout the fine hole and allowing the formation of reliable through wirings free of level differences and voids.

As a result of forming the metal layer on the inner surface near the opening of each fine hole and around the opening of the fine hole on the outer surface of the work piece, the outflow of the plating solution from the fine hole when the work piece is removed from the plating solution can be more reliably prevented due to the wettability of the plating solution with respect to the metal layer around the opening. In addition, when a substrate is removed from the plating solution, by taking advantage of the formation of a layer of the conductive metal along this metal layer (metal layer around the opening), wiring grounded sections, bumps and so forth can be formed on the substrate by cooling and solidifying the plating solution on this metal layer.

If the above external metal section is formed by cooling and solidifying the plating solution that is continuous with the fine hole and has been padded at those locations where the metal layer is present that has been formed in the opening of each fine hole in the outer surface of the work piece as well as around the opening, since this external metal section is formed unitarily with filled metal section formed by the plating solution that solidifies within the fine hole, there is the advantage of the absence of defective bonding and so forth with the filled metal section. In addition, there are also no problems such as brittleness of a bonded section (bonded section between the external metal section and filled metal section) caused by differences in coefficients of thermal expansion or diffusion of materials like those which occur in the case of the external metal section and filled metal section being of different materials, thereby resulting in improved long-term reliability.

In the formation of the metal layer around the opening of each fine hole in the outer surface of the work piece, bumps and so forth of a target size can be formed easily by patterning the metal layer according to the target shape of the external metal portions (such as bumps) to be formed. In this case, the range of formation of the metal layer around the opening of the fine hole in outer surface of the work piece can be adjusted by patterning, offering the advantage of being able to easily adjust the height, size and so forth of the bumps.

BRIEF DESCRIPTION OF THE DRAWINGS

FIG. 11A is a cross-sectional view showing the state in which a substrate has been immersed in the plating solution after having reduced the pressure in a decompression chamber, while

PREFERRED EMBODIMENTS

The following provides an explanation of embodiments of the present invention with reference to the drawings.

First Embodiment

First, an explanation is provided of a metal filling method and member with filled metal sections of a first embodiment as claimed in the present invention.

The metal filling method of this embodiment is a method for forming through wirings and bumps for connecting wiring patterns on the top and bottom sides (both the top and bottom sides correspond to the outer surfaces of a work piece) of a work piece in the form of a substrate (work piece may hereinafter be referred to as the "substrate", and hereinafter, the metal filling method of this embodiment may be referred to as the "through wiring forming method").

Figure 1:
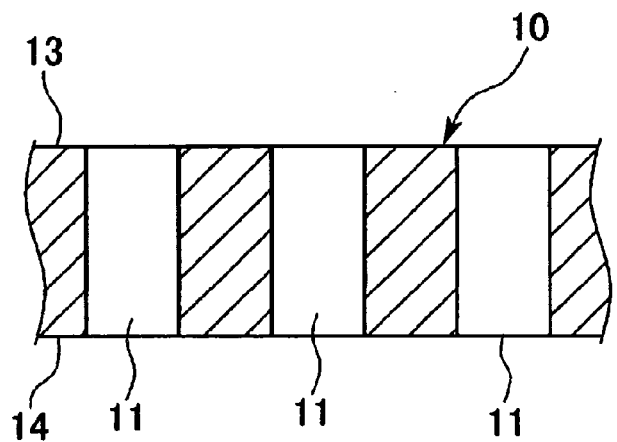
FIG. 1 is a cross-sectional view of a first embodiment of the present invention showing the substrate to be used.

As shown in FIG. 1, the substrate 10 used in this metal filling method has a plurality of fine holes in the form of through holes 11 for through wirings (hereinafter, fine holes may be referred to as "through holes") formed therein. Here, although a silicon substrate in the form of the substrate 10 is used, the substrate is not limited to this type, but rather semiconductor materials such as gallium arsenide (GaAs), insulating materials such as glass or ceramics, or synthetic resin substrates can also be used. Moreover, a compound substrate can also be used in which, for example, an epoxy resin or other organic material is unitarily laminated with a glass or silicon substrate. In addition, a substrate in which an electrical circuit is formed directly on one or both primary sides (top and bottom sides), a substrate in which a platform for forming a circuit is formed on one or both primary sides, substrates that are combinations of these or substrates of various other constitutions can also be employed. Furthermore, the thickness of the substrate 10 is on the order of several hundred micrometers.

The through wirings formed in the substrate 10 are equivalent to the filled metal sections as claimed in the present invention, while bumps are equivalent to the external metal sections as claimed in the present invention. In this embodiment, "substrate" can be read to mean a work piece, "through holes" can be read to mean fine holes, "through wirings" can be read to mean filled metal sections, and "bumps" can be read to mean external metal sections. In addition, those locations where a "through wiring forming method" is described can be read to mean a metal filling method.

This through wiring forming method is composed of a step in which a metal layer is formed (metallized) on the inner surface of the openings and around the openings of through holes on the top and bottom sides of a substrate (metallization step), a plating solution filling step in which a substrate on which this metallization step has been completed is immersed in a plating solution (the conductive metal heated to melting) stored in a plating solution bath to fill the plating solution into through holes, and a cooling and solidification step in which through wirings and bumps are formed by solidifying the plating solution within the through holes and the plating solution padded in a protruding state on the substrate continuous with the through holes by cooling the substrate that has been removed (referring specifically here to being lifted up) from the plating solution bath after the plating solution filling step.

(Metallization Step)

Figure 2:
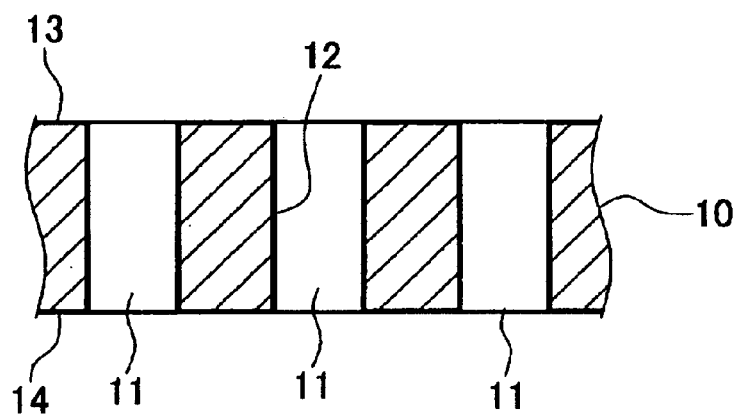
FIG. 2 is a cross-sectional view showing the state in which an oxide film has been formed as an electrical insulating layer by thermal oxidation treatment of the substrate of FIG. 1.

As shown in FIG. 1, the substrate 10 is prepared and an oxide film in the form of an electrical insulating layer 12 (hereinafter, an electrical insulating layer may be referred to as an "oxide film") is formed on the entirety of the substrate 10 by thermal oxidation treatment of this substrate 10 (FIG. 2).

The through holes 11 are fine holes having a diameter on the order of several tens of micrometers (e.g., 50 μm) that pass through the substrate 10, and are opened in a top surface 13 and bottom surface 14 of the substrate 10. The oxide film 12 formed by thermal oxidation treatment of the substrate 10 is formed not only on the top surface 13 and bottom surface 14 of the substrate 10, but also on the inner surface of the through holes 11.

Furthermore, here "top surface" refers to surface facing upward in the plating solution filling step (see FIGS. 9 through 13) to be described later (one side), while the "bottom surface" refers to the surface facing downward (other side).

In this embodiment, an explanation is provided of the example of the case of using DRIE as the means for forming fine holes (through holes 11) in a work piece (substrate 10). In the DRIE method of this embodiment, as a result of using sulfur hexafluoride ($SF_6$) for the etching gas, and alternately carrying out etching by high-density plasma and passivation deposition onto the substrate wall surface (Bosch process), the through holes 11 that pass through the primary surfaces (top surface 13 and bottom surface 14) on both sides of the substrate 10 are formed by deep etching of the substrate 10.

In addition, it goes without saying that wet etching using the previously described etching solution or a mechanical processing method using a microdrill and so forth can also be employed as the technique for forming fine holes (through holes 11) in the work piece (substrate 10) besides the above DRIE method. In the case of applying wet etching to the formation of fine holes in the substrate 10 made of silicone, aqueous potassium hydroxide solution (KOH) and so forth is used for the etching solution.

Figure 3:
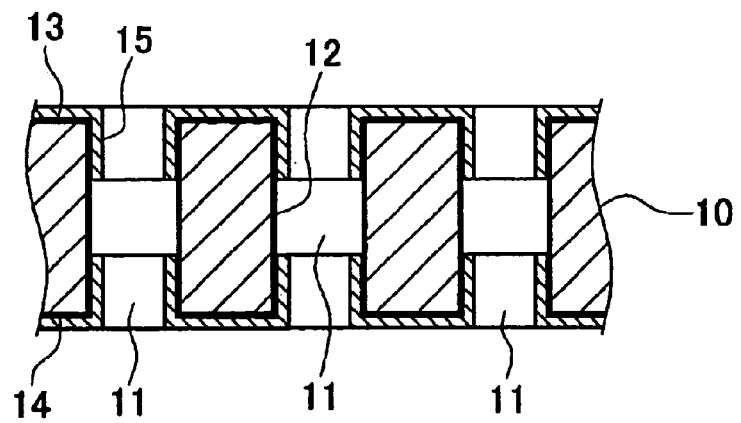
FIG. 3 is a cross-sectional view showing the state in which a metal layer has been formed on the substrate following the thermal oxidation treatment of FIG. 2.

Next, as shown in FIG. 3, a metal layer 15 is formed by metal sputtering on the inner surface of the openings (inner surface of through holes in the vicinity of openings) of the through holes 11 on the top surface 13 and bottom surface 14 of the substrate 10, and around the openings of the through holes 11 on the top surface 13 and bottom surface 14.

Figure 4:
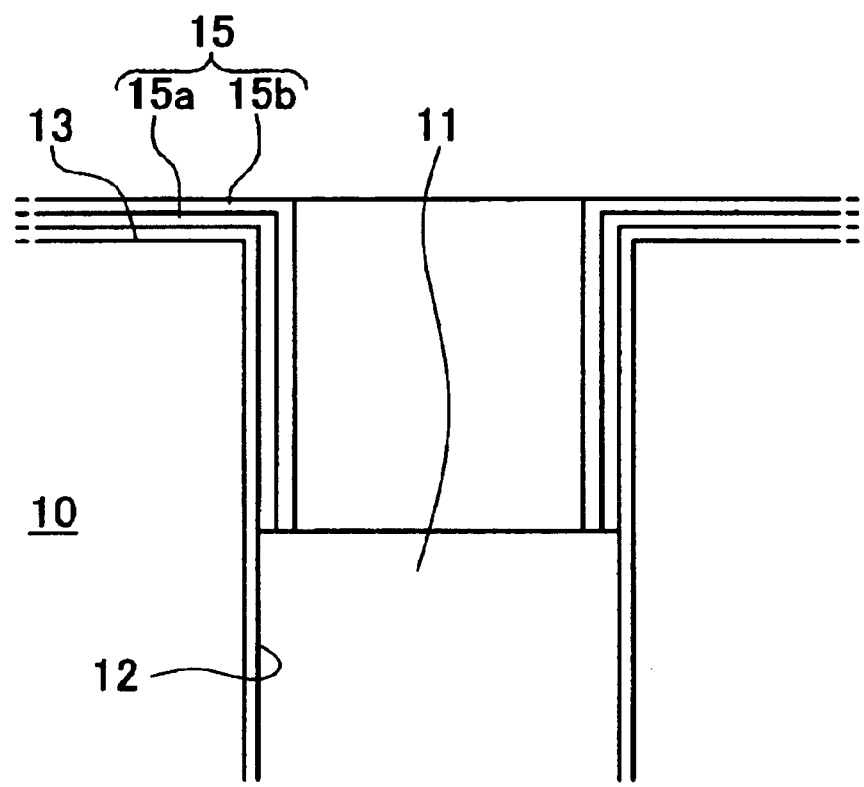
FIG. 4 is a cross-sectional view showing the details of the metal layer of FIG. 3.

More specifically, as shown in FIG. 4, a first layer 15a in the form of a chromium (Cr) layer having a thickness of about 300 Å is first formed by sputtering, after which a second layer 15b in the form of a gold (Au) layer having a thickness of about 5000 Å is layered and formed on the above first layer 15a. The metal layer 15 formed on the inner surface of the through holes 11 is formed at least about several tens of micrometers in towards the center in the axial direction of the through holes 11 from the top surface 13 or bottom surface 14 of the substrate 10.

Furthermore, the metal film 15 may be formed over the entire inner surface of the through holes 11, and in order to reliably fill the plating solution without causing the occurrence of voids inside the through holes 11 by ensuring wettability with the plating solution filled in the through holes 11, the metal layer 15 is preferably formed over a wide a range as possible within the through holes 11. In other words, the range of which the metal layer 15 is formed on the inner surface of the through holes 11 is at least the inner surface of the through holes 11 near the openings of the through holes 11 on the side of the top surface 13 (a range of at least several tens of micrometers from the openings of the through holes 11 towards the center in the axial direction), more preferably the inner surface in the vicinity of the openings in both the top and bottom surfaces of the substrate 10 (in other words, near both ends in the axial direction of the through holes 11; and, over a range on the order of at least several tens of micrometers from the openings of the through holes 11 towards the center in the axial direction on either end), and most preferably the entire inner surface of the through holes 11.

In addition, in the formation of the metal layer 15 using sputtering, since the metal layer 15 can be formed as long as it is formed within the range that can be reached by metal atoms as a result of sputtering, other metals may also be used in addition to the chromium and gold mentioned above.

On the other hand, the metal layer 15 formed around the openings of the through holes 11 in the top surface 13 and bottom surface 14 are formed over a larger area than the formation range of bumps corresponding to the size of the target bumps to be formed (and may be formed entirely over the top surface 13 or top surface 14 of the substrate 10), and is patterned to size corresponding to the bump formation range in the step shown in FIGS. 5 and 6 to be described later.

Furthermore, the metal that forms the first layer 15a and second layer 15b of the metal layer 15 is not limited to the above-mentioned chromium or gold, but may also be another metal.

Figure 5:
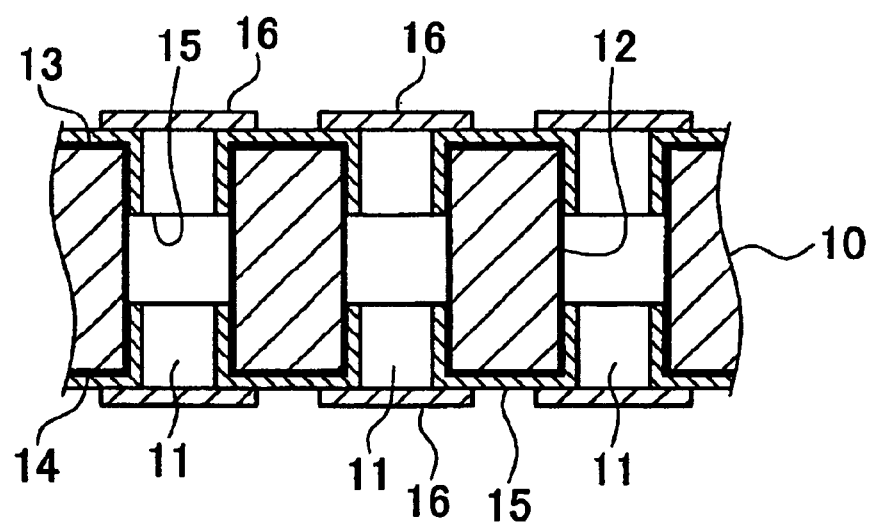
FIG. 5 is a cross-sectional view showing the state in which a photosensitive resist has been applied to the substrate on which the metal layer of FIG. 3 has been formed.
Figure 6:
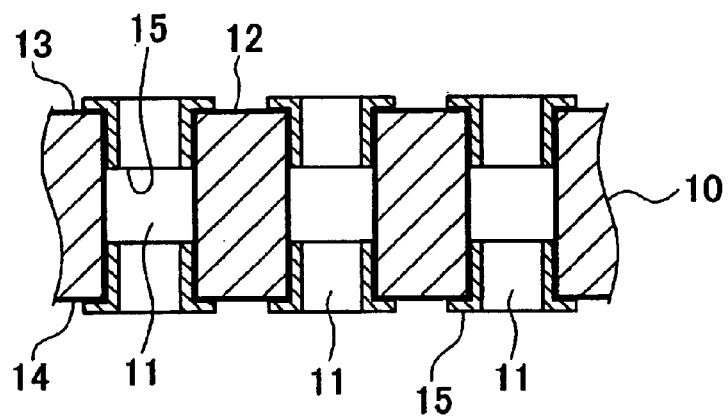
FIG. 6 is a cross-sectional view showing the state in which the photosensitive resist has been removed from the substrate of FIG. 5.
Figure 7:
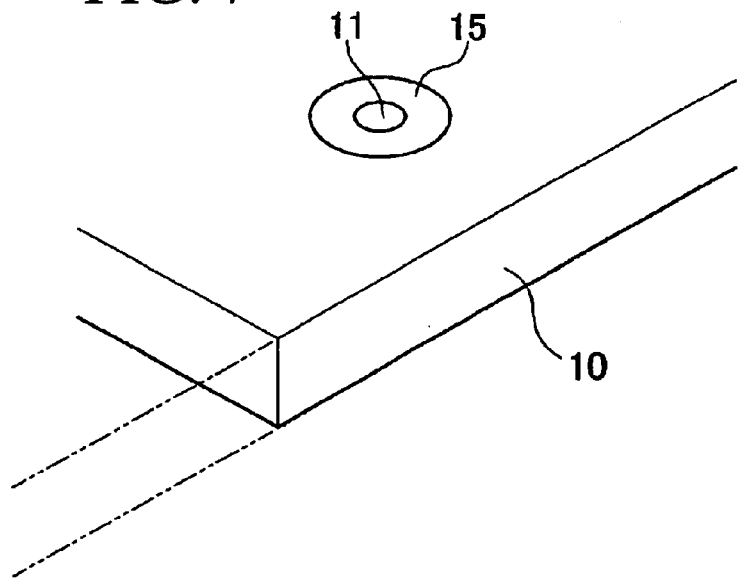
FIG. 7 is a perspective view showing an example of forming by patterning a metal layer on a substrate surface.

Once formation of the metal layer 15 has been completed, as shown in FIG. 5, a photosensitive resist 16 is applied to the top surface 13 and bottom surface 14 of the substrate 10, and this photosensitive resist 16 is patterned by photolithography technology. Next, as shown in FIG. 6, a metal pattern (made of the metal layer 15) is formed of a shape that matches a desired bump size to be formed around the openings of the through holes 11 on the top surface 13 and bottom surface 14 of the substrate 10 by etching the metal layer 15 (first layer 15a and second layer 15b). FIG. 7 shows an example of the form of the metal layer 15 formed by patterning. As a result, the metal layer 15 of a target shape is formed around the openings of the through holes 11 on the top surface 13 and bottom surface 14 of the substrate 10 to complete the metallization step.

Furthermore, the formation of the metal layer 15 by patterning on the top surface 13 and bottom surface 14 of the substrate 10 is not limited to matching a bump size to be formed, but rather may also, for example, be formed to a shape that matches the grounding section of pattern wiring formed on the top surface 13 and bottom surface 14, or may be formed to a shape that forms a portion of pattern wiring.

The work piece (substrate 10) in which fine holes are formed is subjected to a plasma pretreatment step prior to filling of the plating solution. Here, this plasma pretreatment step consists of cleaning for 1 minute with oxygen ($O_2$) plasma to clean and remove plasma layer residue and foreign objects on the outer surface of the work piece with plasma. Consequently, it becomes easy to uniformly fill the plating solution into the fine holes. Furthermore, the plasma used for cleaning is not limited to oxygen plasma, but rather may also be hydrogen ($H_2$) plasma or argon (Ar) plasma or any combination thereof. In addition, this plasma pretreatment step may not only be carried out prior to filling of the plating solution, but may also be carried out prior to forming the metal layer on the work piece.

(Plating Solution Filling Step)

Figure 8:
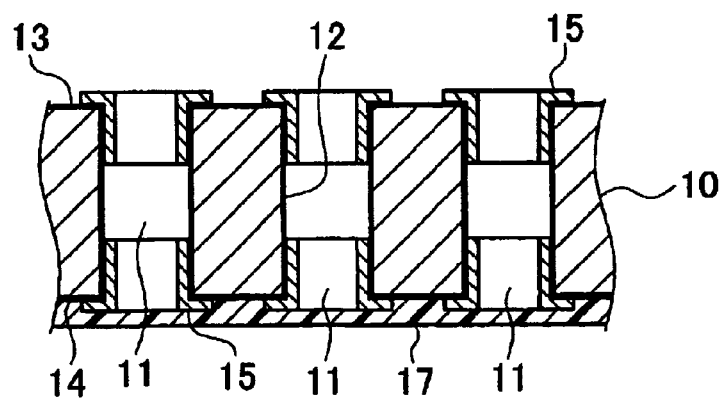
FIG. 8 is a drawing showing the state in which the openings of through holes have been covered by affixing a heat-resistant film to the bottom surface of a substrate on which the patterning of the metal layer of FIG. 7 has been completed.

Following completion of the metallization step, as shown in FIG. 8, a heat-resistant film in the form of sealing material 17 (hereinafter, this sealing material may be referred to as a "heat-resistant film") is affixed to the bottom surface 14 of the substrate 10, to occlude the openings of the through holes 11 on the bottom surface 14.

Polyimide film, for example, can be used for the heat-resistant film, and a particularly preferable example of a polyimide film is Kapton (registered trademark). In the case of Kapton, it is preferable to use a grade that does not become hard at the temperature (melting point) of the conductive metal, and in this case, is advantageous with respect to being able to easily separate the heat-resistant film from the substrate 10 after having been removed (more specifically, lifted out; see FIG. 13) from the plating solution 20 in the cooling and solidification step to be described later. In addition, a compound film or tape and so forth in which two Kapton polyimide films or different resin films are laminated using a silicon-based adhesive can be employed for the heat-resistant film. The use of a sealing material in the form of a film or tape using Kapton (including film composed of Kapton alone), on one side of which is coated a pressure-sensitive adhesive for adhering to a work piece, is preferable in terms of ease of through hole sealing work. However, the above pressure-sensitive adhesive that is used should not become hard at the temperature (meting point) of the conductive metal, and should facilitate peeling from the work piece after having been removed from the plating solution.

It goes without saying that the air pressure in the through holes 11 should be at atmospheric pressure when one end in the axial direction of each through holes 11 is occluded by affixing the sealing material 17, since the work of affixing the sealing material 17 is performed at atmospheric pressure.

Figure 9:
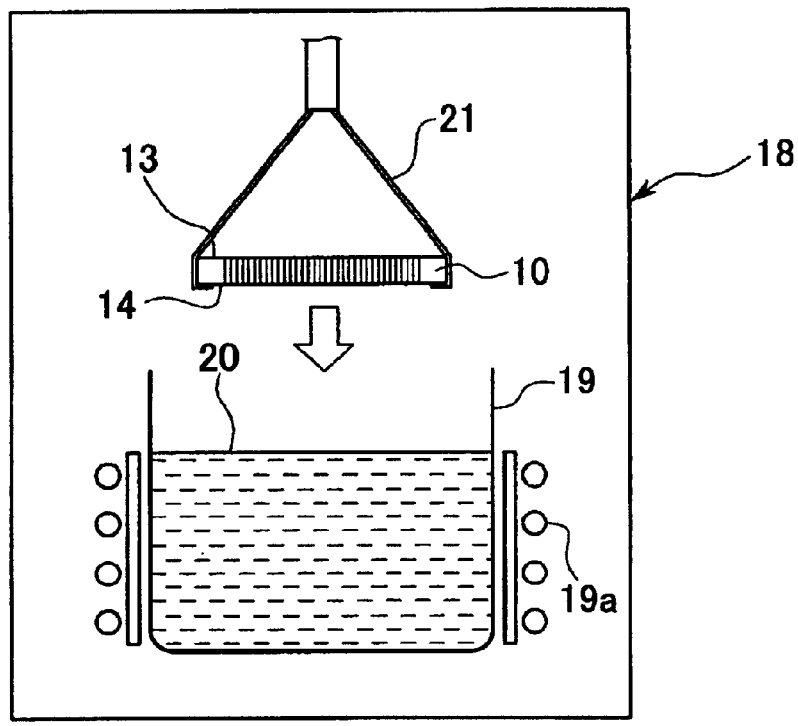
FIG. 9 is a cross-sectional view showing a decompression chamber that is applied to the forming method of through wirings as claimed in the present invention.
Figure 10:
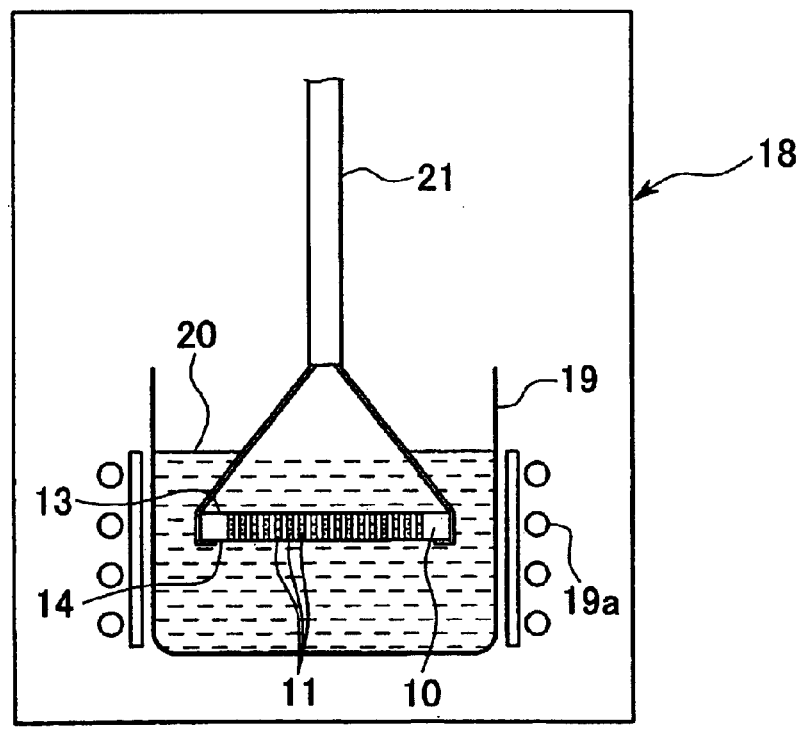
FIG. 10 is a drawing showing the state in which a substrate has been immersed in a plating solution stored in a plating solution bath installed within the decompression chamber of FIG. 9.

Next, as shown in FIG. 9, this substrate 10 is housed in a decompression chamber 18, the pressure inside the decompression chamber 18 is reduced, and the substrate 10 is immersed in the plating solution 20 stored in a plating solution bath 19 inside the decompression chamber 18 while maintaining this state of reduced pressure (see FIG. 10). Here, a vacuum pressure on the order of $10^{-3}$ to $10^{-5}$ Pa for an aspect ratio of the through holes 11 of 0.1 to 200 is suitable for the reduced pressure. In FIGS. 9 and 10, reference symbol 19a indicates heaters provided around the plating solution bath 19. Immersion of the substrate 10 into the plating solution 20 is carried out in a state in which this substrate 10 is maintained nearly horizontal by attaching a raising and lowering jig 21 installed within the decompression chamber 18 and lowering this raising and lowering jig 21.

Furthermore, the substrate 10 attached to the raising and lowering jig 21 is raised and lowered while maintained nearly horizontal by raising and lowering of the raising and lowering jig 21, and removal of this substrate 10 from the plating solution 20 is also carried out while maintaining the substrate 10 nearly horizontal.

The sealing material 17 is not limited to a heat-resistant film, but rather may be any material that is capable of sealing the openings of the through holes 11 on the bottom surface 14 of the substrate 10, and its shape is also not limited to a constitution in which it covers the entirety of the bottom surface 14 as with the previously mentioned heat-resistant film.

Here, although the plating solution 20 is specifically that which has resulted from the heating and melting of a gold-tin eutectic binder (Au-20 wt % Sn), the plating solution as claimed in the present invention is not limited to this, but rather a binder based on a gold-tin alloy having a different composition, or a tin (Sn), indium (In) or other metal binder, as well as a tin-lead (Sn—Pb)-based, tin (Sn)-based, lead (Pb)-based, gold (Au)-based, indium (In)-based or aluminum (Al)-based binder can also be used. However, a combination between the metal layer (and particularly the surface layer) and the plating solution should be selected so as to adequately ensure wettability between them.

Immersion of the substrate 10 into the plating solution 20 is carried out with the bottom surface 14 to which the sealing material 17 is affixed facing downward, and the top surface 13 facing upward, and the entirety of the substrate 10 is submerged in the plating solution 20 so that the top surface 13 is not exposed. However, at this stage, inflow of the plating solution 20 into the through holes 11, which are fine holes having a high aspect ratio and a diameter on the order of several tens of micrometers that pass through the substrate 10 having a thickness on the order of several hundred micrometers, has hardly begun.

Figure 11A:
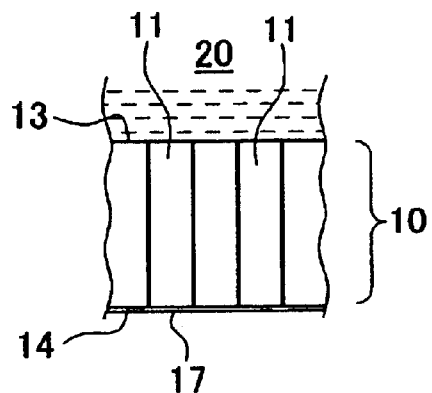
Figure 11B:
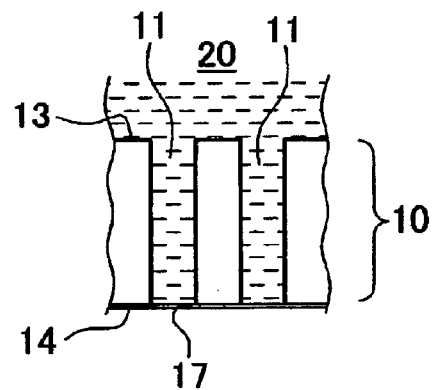
FIG. 11B is a cross-sectional view showing the state in which the plating solution has been filled into through holes of a substrate by pressurizing the inside of the decompression chamber.
Figure 12:
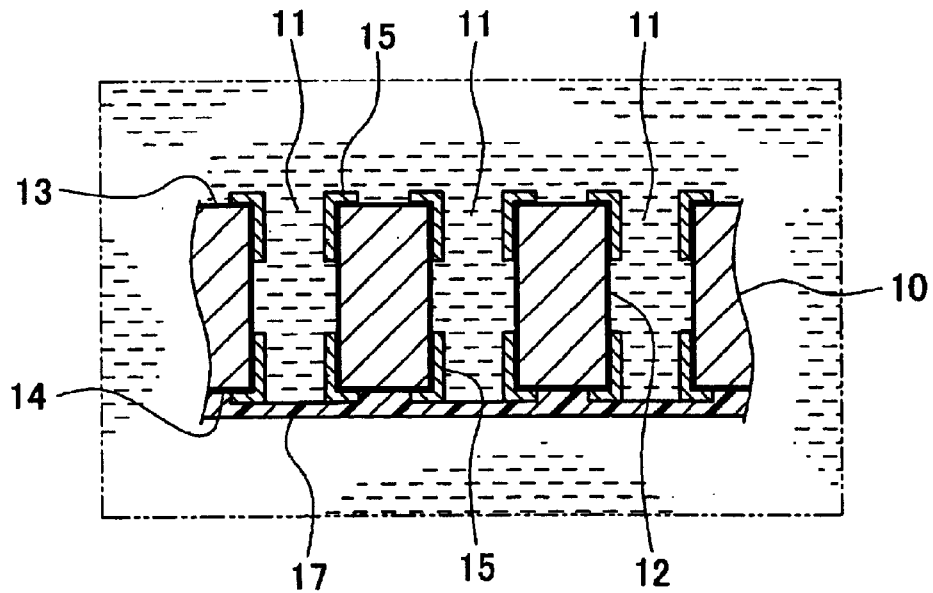
FIG. 12 is a cross-sectional view showing the details of the state of FIG. 11B.

Once immersion of the substrate 10 into the plating solution 20 has been completed, the inside of the decompression chamber 18 is pressurized. As shown in FIG. 11A, prior to pressurization of the inside of the decompression chamber 18, since a state of reduced pressure in the through holes 11 in which the plating solution 20 is has not flown is maintained by the plating solution 20 and sealing material 17 that cover the openings (openings on the side of the top surface 13) of the through holes 11. Therefore, by pressuring the inside of the pressurization chamber 18, the plating solution 20 is able to reliably flow into and fill the inside of the through holes 11 (see FIGS. 11B and 12). The pressure during this pressurization should be equal to or greater than atmospheric pressure. In addition, at this time, since the wettability of the plating solution 20 is ensured by the metal layer 15 formed on the inner surface of the end portion of each through holes 11 on the side of the bottom surface 14, the plating solution 20 acclimates well with the inner surface of the through holes 11 even in the vicinity of the side of the bottom surface 14 of the through holes 11, and since it is filled without forming voids within the through holes 11, the plating solution 20 can be reliably filled throughout the through holes 11.

Pressurization of the inside of the decompression chamber 18 can also be carried out by feeding an inert gas such as nitrogen gas into the decompression chamber 18, and in this case, incorporation of oxygen into the plating solution prior to solidification can be prevented by the inert gas atmosphere, thereby offering the advantage of preventing deterioration of the properties of the plating solution on the substrate 10 and inside the through holes 11.

(Cooling and Solidification Step)

Figure 13:
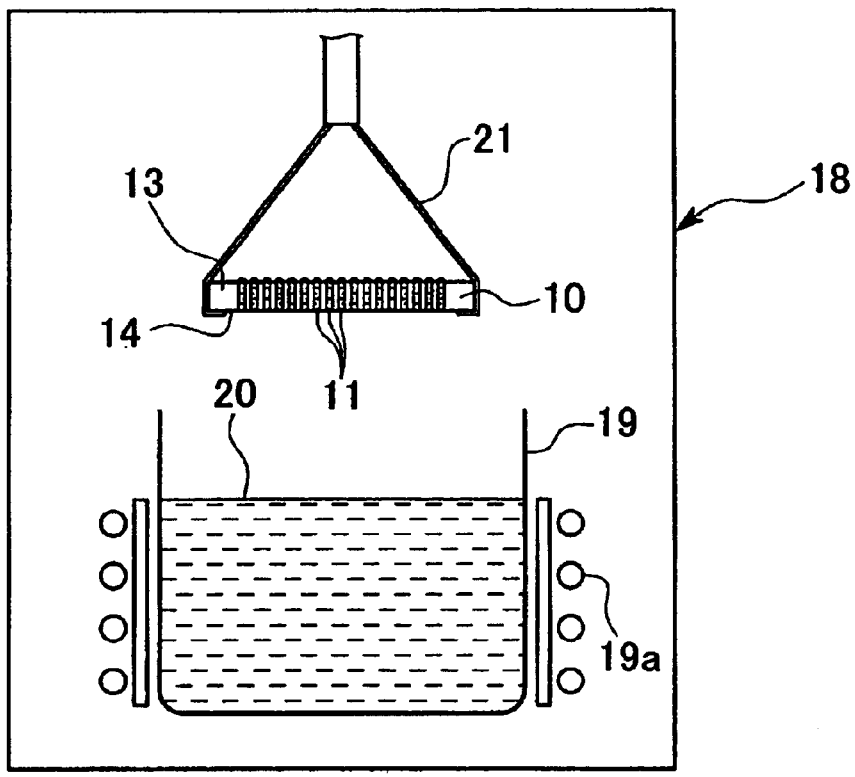
FIG. 13 is a drawing showing the state in which a substrate has been removed from the plating solution stored in a plating solution tank installed within the decompression chamber of FIG. 9.

Once filling of the plating solution 20 into the through holes 11 is completed, as shown in FIG. 13, the substrate 10 is lifted out from the plating solution 20. At this time, since openings of the through holes 11 on the side of the bottom surface 14 are maintained in a state of being occluded by the heat-resistant film 17, the plating solution 20 within the through holes 11 does not come out from the bottom surface 14. In addition, there is also no occurrence of the problem of the plating solution 20 filled into the through holes 11 running out from the openings of the through holes 11 on the side of the top surface 13 due to the wettability of the plating solution 20 with respect to the metal film 15 formed on the inner surface near the openings of the through holes 11 on the side of the top surface 13 and around those openings.

The plating solution 20 along a metal pattern (made of the metal film 15) formed in the metallization step remains adhered on the top surface 13 of the substrate 10 without failing off after the substrate 10 has been lifted out from the plating solution 20. In areas other than the metal pattern, since the wettability of the plating solution 20 with respect to the substrate 10 is poor, the plating solution 20 drops off accompanying lifting of the substrate 10 from the plating solution 20.

For example, as shown in FIG. 7, in the case a circular metal layer 15 has been formed around the opening of each through holes 11 corresponding to the shape of a bump, the plating solution 20 continuous with the through holes 11 is padded at the areas where this metal layer 15 and the opening of the through hole 11 are present (area where the metal layer 15 is present on the top surface 13 and area where the opening of the through hole 11 is present).

Figure 14:
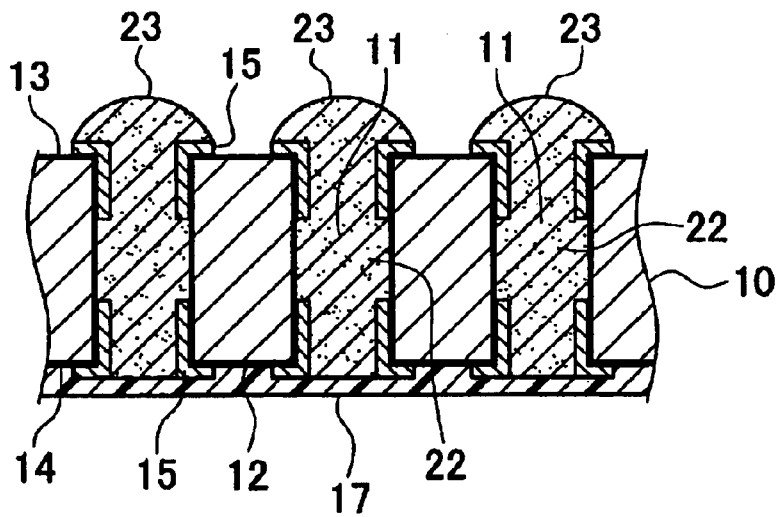
FIG. 14 is a cross-sectional view showing the state in which through wirings and bumps have been formed by cooling a substrate that has been removed from the plating solution.

Once the substrate 10 is lifted out of the plating solution 20, the substrate 10 is cooled to solidify the plating solution 20 filled into the through holes 11 as well as the above patted plating solution 20. As a result, as shown in FIG. 14, through wirings 22 comprised by solidifying the plating solution 20 in through holes 11, and bumps 23 protruding from the top surface 13, are formed unitarily to obtain a substrate with through wirings in which filled metal sections (through wirings 22) and external metal sections (bumps 23) have been formed.

As was previously described, since outflow of the plating solution 20 from the through holes 11 accompanying lifting out of the substrate 10 from the plating solution 20 is prevented, and the filled state of the plating solution 20 in the through holes 11 can be reliably maintained, the through wirings 22 are reliably obtained without defects such as internal voids. In addition, since the plating solution 20 is a peak shape at the areas where the metal layer 15 and openings of the through holes 11 are present due to its surface tension, as a result of cooling and solidifying the plating solution 20, a peak-shaped bumps 23 are formed protruding from the top surface 13.

In this manner, in a constitution in which the through wirings 22 and bumps 23 are formed unitarily, there are no problems such as defective bonding and electrical properties can be reliably ensured as compared with constitutions in which the bumps are formed separately from through wirings and then bonded with through wirings. In addition, there is also no problem of brittleness of bonded sections (bonded sections between the bumps and through wirings) caused by differences in coefficients of thermal expansion or diffusion of materials as occurs in the case of the bumps and through wirings being of different materials, thereby enabling long-term reliability to be improved.

Figure 15:
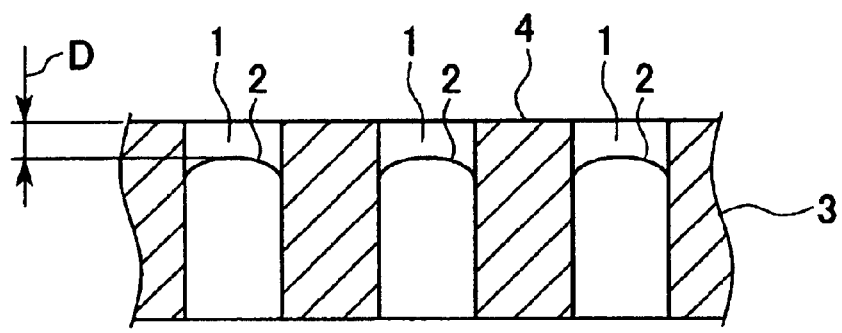
FIG. 15 is a cross-sectional view showing the state in which through wirings have been formed in through holes of a substrate by a through wiring forming method of a comparative example.

FIG. 15 is a drawing of a comparative example in which metal layer 15 is not formed on a substrate, namely only a plating solution filling step and cooling and solidification step are carried out without carrying out a metallization step. In FIG. 15, a substrate 3 is the same as the substrate 10 explained in the present embodiment, and the plating solution indicated with reference symbol 2 in FIG. 15 is the same as the plating solution 20 explained in the present embodiment. In this case as well, although a plating solution 2 has been filled into the entirety of through holes 1 of the substrate 3 in the plating solution filling step, the plating solution flows out from the through holes 1 when the substrate 3 is lifted out from the plating solution in the plating solution bath 19, and as a result, the plating solution 2 was confirmed to be insufficiently filled into the through holes 1, and a level difference D was confirmed to be formed in which the upper surface of the plating solution 2 was several micrometers to several tens of micrometers lower than a surface 4 of the substrate 3 that is the upper side when the substrate 3 is lifted out of the plating solution 2. On the basis of these results, it is clear that the through wiring forming method as claimed in the present invention demonstrates effects that prevent the outflow of the plating solution by the metal layer 15 formed on the inner surface of the through holes in the vicinity of openings and around the openings of the through holes in the top surface.

Furthermore, although the through wiring forming method as claimed in the present invention has also been verified with respect to the case of forming the metal layer only on the inner surface of through holes in the vicinity of openings, but omitting the formation of the metal layer around the openings of the through holes in the top surface of the substrate, although it is difficult to form bumps of adequate size, the outflow of the plating solution from the through holes accompanying lifting of the substrate from the plating solution can be prevented, and there is no occurrence of problems such as the occurrence of a level difference due to insufficient filling of the plating solution. In this case, for example, effects are obtained such as being able to reduce the occurrence of bonding defects to an extremely low level when forming bumps to be bonded with through wirings in a separate step.

Second Embodiment

Next, an explanation is provided of a second embodiment of the present invention.

In a metal filling method of this embodiment, a substrate (hereinafter, work piece may be referred to as a "substrate") in which non-through holes 51 (fine holes) are formed is employed as a work piece 50a, and filled metal sections and bumps are formed by filling the plating solution into the non-through holes 51 and solidifying the plating solution.

Figure 16:
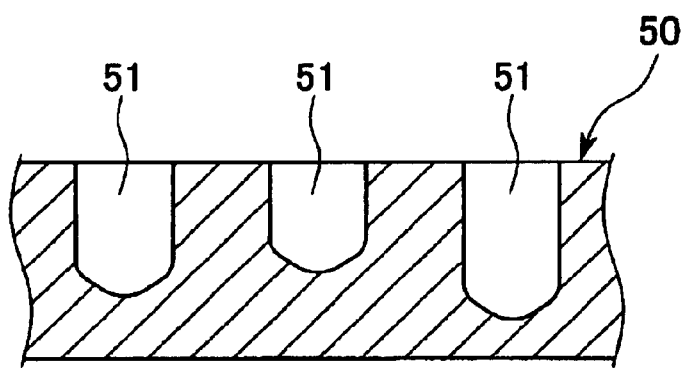
FIG. 16 is a cross-sectional view showing a substrate that is applied to a second embodiment of the present invention.

As shown in FIG. 16, in the present embodiment, a glass substrate in which a plurality of fine holes in the form of non-through holes 51 are formed, is used as an example of a constitution of the substrate 50, however, the constitution other than the non-through holes 51 of the substrate 50 (such as the material) can be the same as that of the substrate 10 of the first embodiment.

The non-through holes 51 formed in the substrate 50 function as inner via holes and so forth. The inner diameter of these non-through holes 51 may be the same as the through holes 11 (fine holes) of the substrate 10 of the first embodiment. All of the non-through holes 51 formed in substrate 50 are open only on one side of the substrate 50 (here, a top surface 53), and are formed so as to be extending towards a bottom surface 54 of the substrate 50 in nearly a straight line from the openings in the top surface 53.

In this metal filling method, a metallization step, a plating solution filling step, and a cooling and solidification step are carried out using the substrate 50 in the same order as the first embodiment. However, since the fine holes 51 of the substrate 50 used in this metal filling method are non-through holes, only one end along the axial direction is open in the outer surface of the substrate 50 (here, the top surface 53), and the other end in the axial direction is occluded, it is not necessary to use a sealing material when removing (and more specifically, lifting out) the substrate 50 from the plating solution 20 after having been immersed in the plating solution 20 in the plating solution filling step. With the exception affixing and removing the sealing material from the substrate 50, a constitution is employed in which the metallization step, plating solution filling step and cooling and solidification step are carried out in the same manner as the first embodiment. In addition, the plasma pre-treatment step and so forth are also carried out in the same manner as the first embodiment.

Moreover, in the metal filling method explained here, a filled metal section exposure step (to be described later), in which filled metal sections are exposed on the substrate bottom surface is exposed, is added after the cooling and solidification step.

Figure 17:
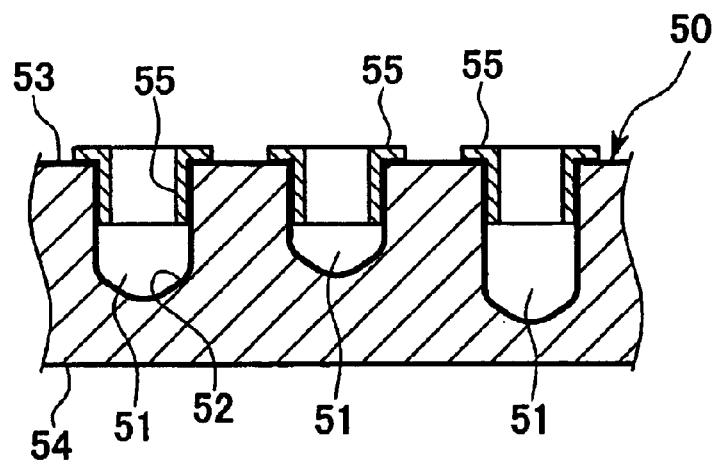
FIG. 17 is a cross-sectional view showing the state in which a metallization step has been completed on the substrate of FIG. 16.

FIG. 17 is a drawing showing the substrate 50 on which a metallization step has been completed, wherein reference symbol 52 indicates an electrical insulating layer such as an oxide film, and reference symbol 55 indicates a metal layer. Although the metal layer 55 is formed on the inner surface of the fine holes 51 and around the openings of the fine holes 51 in the top surface 53 of the work piece 50, similar to the metal layer in the first embodiment, the range over which it is formed on the inner surface of the fine holes 51 is inward to a location at least several tens of micrometers from the openings of the fine holes 51 towards the bottom of the fine holes 51.

Figure 18:
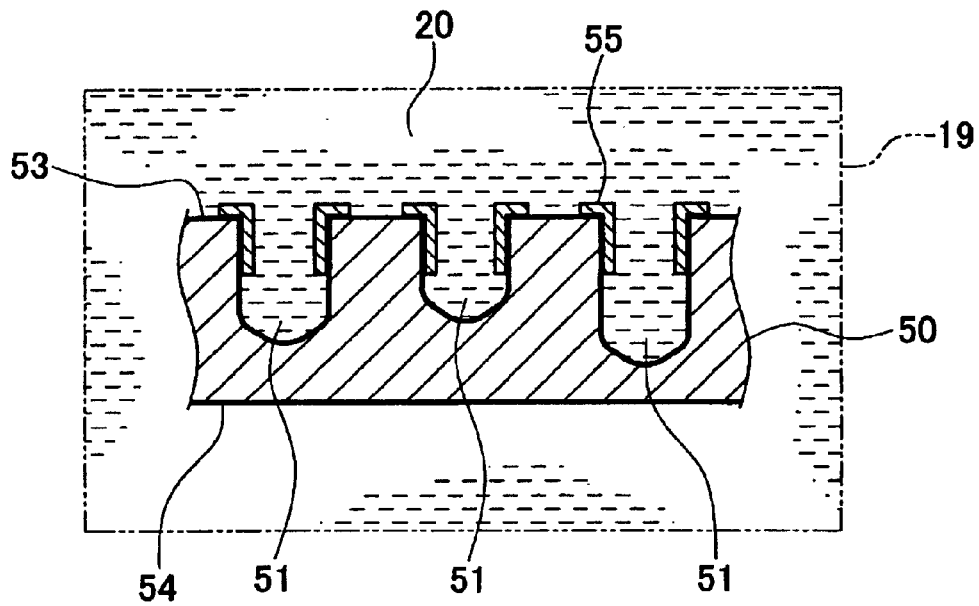
FIG. 18 is a drawing showing the state in which the substrate of FIG. 16 has been immersed in the plating solution in a metal filling step following completion of the metallization step, and shows the state in which it has been immersed in the plating solution in a plating solution bath installed within a decompression chamber.

FIG. 18 is a drawing showing the state in which the substrate 50 is immersed in the plating solution in the metal filling step, and shows the state in which the substrate 50 is immersed in the plating solution 20 within the plating solution bath 19 installed within the decompression chamber 18. Although this metal filling step is the same as that of the first embodiment, the use of a sealing material can be omitted as shown in the drawing.

Figure 19:
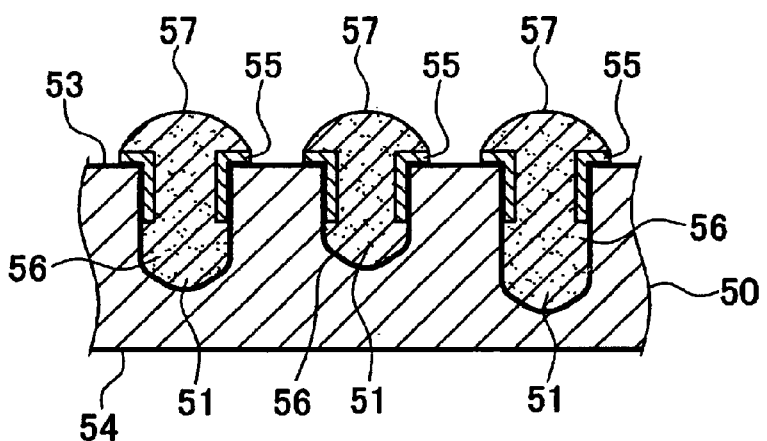
FIG. 19 is a cross-sectional view showing the state in which filled metal sections and external metal sections have been formed by completing cooling of a substrate removed from the plating solution in a cooling and solidification step following completion of the metal filling step of FIG. 18.

FIG. 19 shows the state in which filled metal sections 56 are unitarily formed with external metal sections 57 (e.g., bumps) by cooling the substrate 50 after having been removed from the plating solution 20, and then solidifying the plating solution 20 filled inside the fine holes 51 as well as the plating solution 20 that has been padded so as to protrude from the substrate 50 in the vicinity of the openings of the fine holes 51 in a cooling and solidification step. The substrate 50 shown in FIG. 19, namely, the substrate 50 on which the filled metal sections 56 and external metal sections 57 have been formed, corresponds to a member with filled metal sections as claimed in the present invention.

Figure 20:
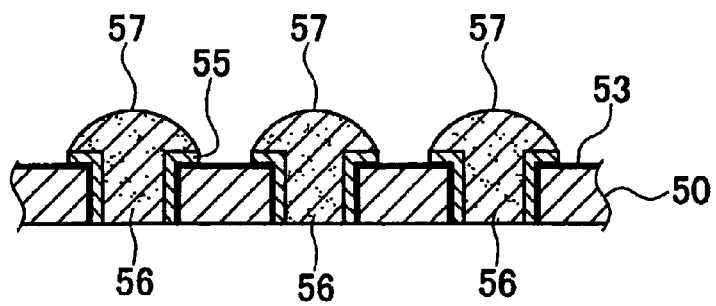
FIG. 20 is a cross-sectional view showing the state in which filled metal sections within fine holes have been exposed by polishing the bottom surface of a substrate in a filled metal section exposure step following completion of the cooling and solidification step of FIG. 19.

FIG. 20 is a drawing showing the above filled metal section exposure step, and shows the state in which the bottom surface of the substrate 50 following completion of the cooling and solidification step is polished to expose the filled metal sections 56 in the fine holes 51. As a result, the filled metal sections 56 are able to function as through wirings and so forth of the substrate 50. The substrate shown in FIG. 20 also corresponds to a member with filled metal sections as claimed in the present inventiont.

Various techniques can be employed for exposing filled the metal sections 56 on the bottom surface of the substrate 50, examples of which include partial removal of the substrate 50 by wet etching in addition to the polishing method mentioned above.

Third Embodiment

The following provides an explanation of a third embodiment of the present invention.

Figure 21:
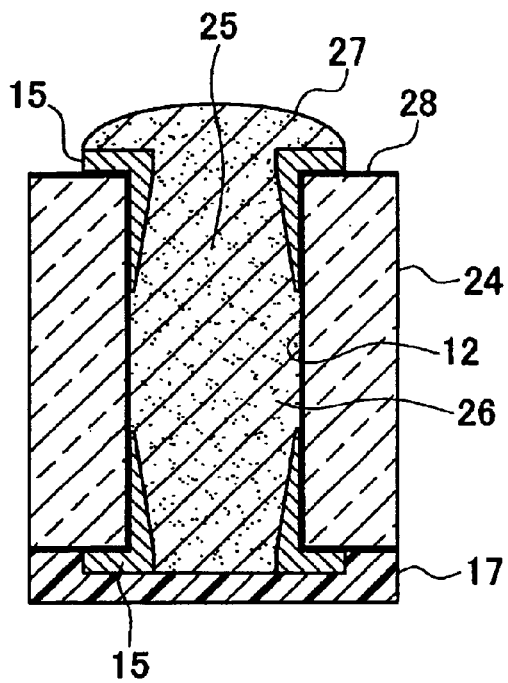
FIG. 21 is a cross-sectional view of a third embodiment of the present invention showing an example of having formed filled metal sections and external metal sections according to the metal filling method as claimed in the present invention in a rod-shaped member containing a through hole.

FIG. 21 shows an example of forming a filled metal section 26 and external metal section 27 by employing a work piece in the form of rod-shaped member 24 (hereinafter, work piece may be referred to as the "rod-shaped member") and filling plating solution in the form of tin into a through hole 25 having a diameter of 0.1 mm and total length of 5 mm provided along the axial direction of this rod-shaped member (vertical direction in FIG. 21) using the same technique as the first embodiment (by sequentially carrying out a metallization step, plating solution filling step and cooling and solidification step in the same manner as previously described, wherein a side 28 of the upper surface of this work piece 24 to be described later corresponds to the substrate top surface, and the opposite side corresponds to the substrate bottom surface). Various types of technique can be employed for forming through holes in the work piece 24, an example of which is the previously mentioned DRIE method.

Although a glass rod is used here for the work piece 24 (rod-shaped member), the work piece is not limited to this, but rather that formed from one type of material selected from ceramic, silicon and various types of synthetic resins, or that formed from a compound material comprised of two or more materials selected from glass, ceramic, silicon and various types of synthetic resins, can also be used. The type and forming method of the metal layer 15, the heat-resistant film 17 and so forth that are employed are the same as those previously described. However, the range over which the metal layer 15 is formed is the range equal to roughly 2 to 3 times the diameter of the through hole 25 from both ends in the axial direction of the through hole 25 towards the center in the axial direction, and roughly several millimeters from the outer circumference of the opening around said opening of the through hole 25 on both opposing sides in the axial direction of the rod-shaped member 24.

Figure 22:
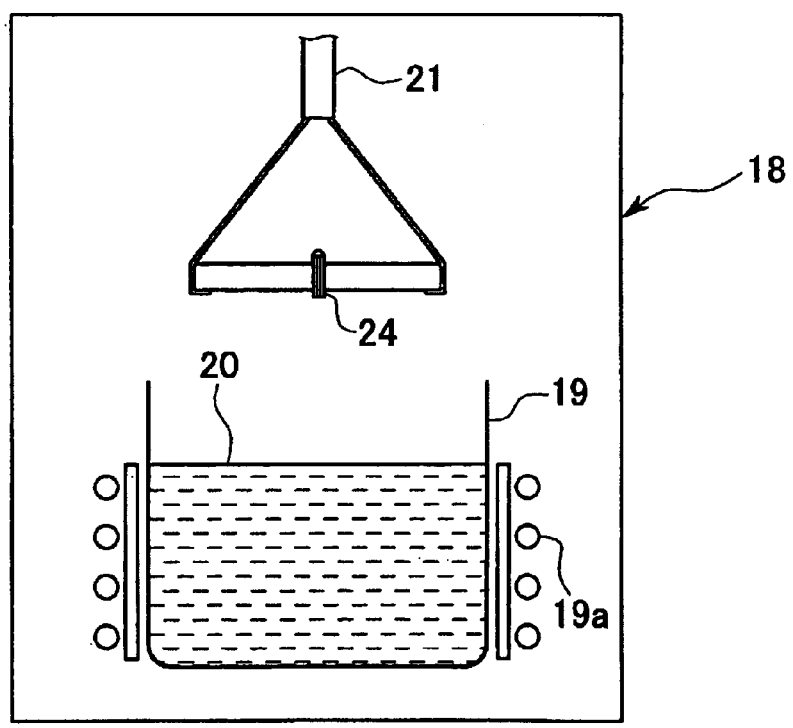
FIG. 22 is a drawing of a step in which the plating solution is filled into the through hole of the rod-shaped member of FIG. 21 that shows the state in which a substrate has been removed from the plating solution stored in a plating solution bath installed inside a decompression chamber.

Although the technique for filling the plating solution into the through hole 25 is the same as the plating solution filling step previously described, immersion and removal of the rod-shaped member 24 with respect to the plating solution stored in the plating solution bath 19 inside the decompression chamber 18 is performed with the side on which the heat-resistant film 17 is provided facing downward. In explaining this with reference to FIG. 22 (FIG. 22 shows the state in which the work piece 24 has been lifted out from the plating solution 20), the work piece 24, following completion of formation of the metal layer 15, is attached to the raising and lowering jig 21 inside the decompression chamber 18, and is raised and lowered within the decompression chamber 18 while maintaining the orientation in which the through hole 25 is vertical by raising and lowering of the raising and lowering jig 21. However, the opening of the other end in the axial direction facing downward in opposition to one end in the axial direction of the through hole 25 facing upward when housed in the decompression chamber 18 is covered in advance with the sealing material 17 prior to being housed in the decompression chamber 18. Once this work piece 24 has been housed in the decompression chamber 18, the pressure inside the decompression chamber 18 is reduced, the work piece 24 is lowered while maintaining this reduced pressure state, and immersed in the plating solution 20 stored within the plating solution bath 19 inside the decompression chamber 18. Next, with the work piece 24 still immersed in the plating solution 20, the inside of the decompression chamber 18 is pressurized causing the plating solution 20 to be filled into the through hole 25. Next, the work piece 24 is raised up, lifted out from the plating solution 20 and cooled.

In this example as well, similar to the case of the previously described substrate 10, filling of the plating solution throughout the through hole 25 can be carried out reliably. In addition, the plating solution continuous with the through hole 25 is padded on the opening of the through hole 25 on the surface 28 of the upper side of the work piece 24 that has been removed (and more specifically, lifted out) from the plating solution 20 (the side of the work piece 24 in which one end of the through hole 25 is open) and where the metal layer 15 is present around the opening. Therefore, the filled metal section 26, which is comprised by cooling the work piece 24 that has been lifted out from the plating solution 20 followed by solidifying the plating solution 20 within the through hole 25, and the external metal section 27, which is comprised by solidification of the above padded plating solution 20, can be formed unitarily, thereby obtaining a member with filled metal sections having the filled metal sections 26 and external metal sections 27.

Here, the solid filled metal sections 26 free of voids can be formed within the resulting member with filled metal sections. In addition, although the diameter (inner diameter) of the through hole 25 is larger than that of the through holes 11 of the substrate 10 previously described, since the filled metal section 26 is such that the through hole 25 is filled throughout, including one end in the axial direction of the through hole 25, and a level difference is not formed on one end in the axial direction of the through hole 25 such that the end of the filled metal section 26 drops in from the side of the work piece 24, outflow of the plating solution from the through hole 25 when the rod-shaped member 24 is lifted out from the plating solution bath 19 is considered to be prevented in this example as well.

Fourth Embodiment

The following provides an explanation of a fourth embodiment of the present invention.

Although this embodiment is the same as the third embodiment with respect to the use of a similar rod-shaped member for a work piece 30 (hereinafter, the work piece may be referred to as a rod-shaped member), as shown in FIG. 11, it differs with respect to a fine hole 31 formed being a non-through hole in which only one end along the axial direction of a rod-shaped member is open, while the other end in the axial direction is not open (hereinafter, the fine hole may be referred to as a non-through hole).

In the metal filling method of this embodiment as well, although a metallization step, plating solution filling step and cooling and solidification step are sequentially carried out in the same manner as the third embodiment, since the fine hole 31 formed in the work piece 30 is a non-through hole, there is no need to use a sealing material.

Figure 23:
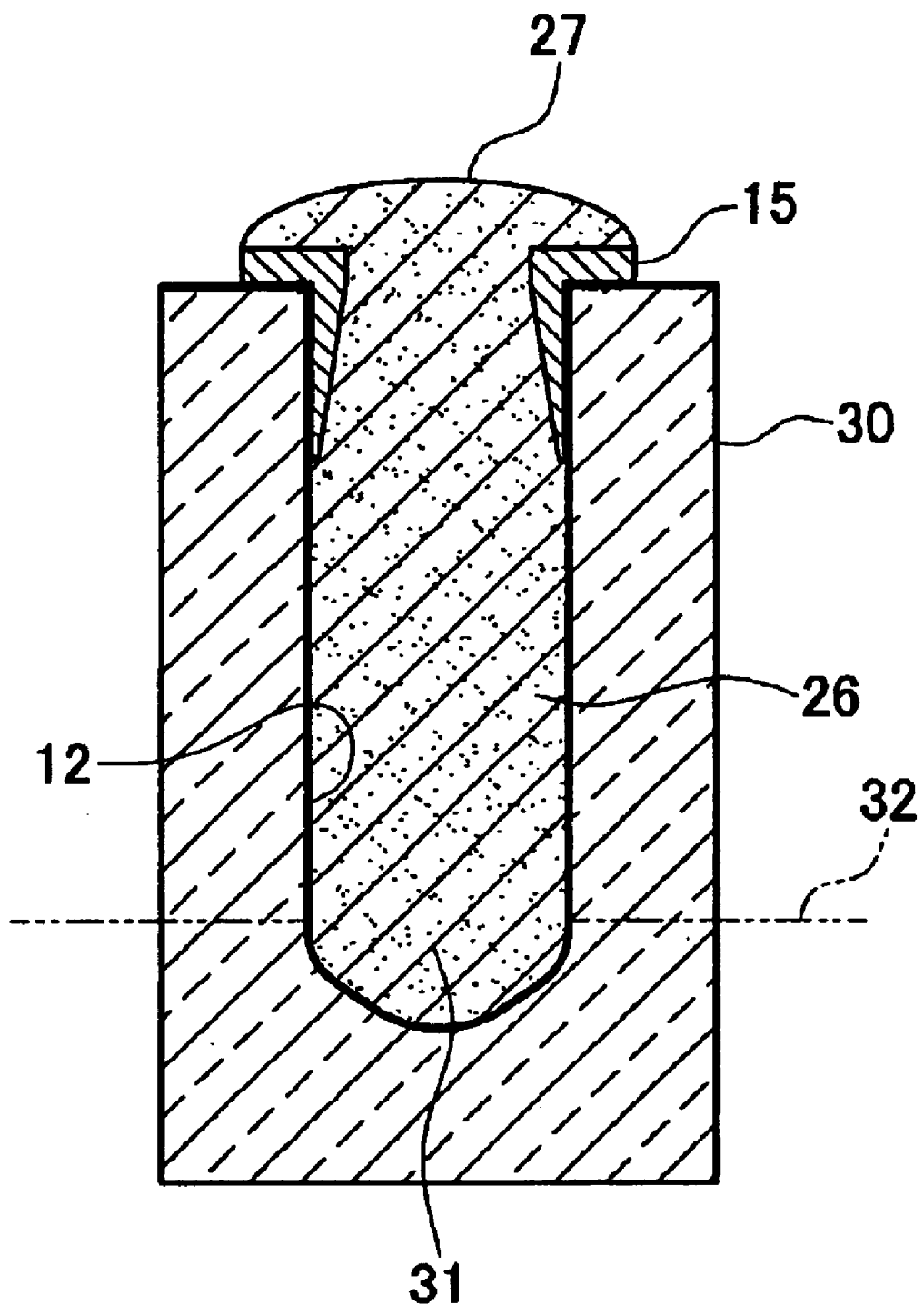
FIG. 23 is a cross-sectional view of a fourth embodiment of the present invention that shows an example of having formed filled metal sections and external metal sections according to the metal filling method as claimed in the present invention in a rod-shaped member containing a non-through hole.

FIG. 23 shows the work piece 30 on which a cooling and solidification step has been completed. As shown in FIG. 23, the work piece 30 on which the filled metal section 26 and external metal section 27 have been formed is a member with metal filled sections as claimed in this embodiment. In addition, in the metal filling method of this embodiment, the filled metal section 26 can also be exposed on the other end in the axial direction of the rod-shaped member 30 by adding a filled metal section exposure step following the cooling and solidification step. In other words, by removing the portion below a virtual line 32 in FIG. 23 of the member with metal filled sections (or the work piece 30) shown in FIG. 23 by polishing and so forth, the metal filled section 26 can be used as a through wiring and so forth since the metal filled section 26 is exposed.

Furthermore, the present invention is not limited to the above-mentioned embodiments, but rather can be altered to achieve various variations.

For example, the technique used to form the metal layer is not limited to the above-mentioned sputtering, but rather plating (by immersing the substrate in plating liquid) and so forth can also be employed.

Although a substrate and rod-shaped member were indicated as examples of a work piece in the above embodiments with respect to the metal filling method as claimed in the present invention, the present invention is not limited to these, but rather various types of shapes, materials and so forth can be used for the specific shape, material and so forth of the work piece.

Immersion of the substrate or work piece into the plating solution and removal from the plating solution are not limited to being carried out in an orientation in which the side on which through holes are occluded by a sealing material in the form of a heat-resistant film is facing downward as was exemplified in the drawings in so forth, but rather a large degree of freedom is able to be secured for the orientation during immersion of the work piece in the plating solution and removal (lifting out) of the work piece from the plating solution depending on, for example, the wettability between the metal layer formed on the inner surface in the vicinity of openings of through holes and the plating solution that has flowed into the through holes, the fluidity of the plating solution and other conditions.

What is claimed is:

1. A member with filled metal sections, the filled metal sections formed by filling metal into fine holes formed in a workpiece; wherein a metal layer is formed on an inner surface of an end of each of said fine boles that opens to an outer surface of said workpiece of which the inner surface and the outer surface are formed with an insulating layer, and a filled metal section is filled at a site that includes the end of each of said fine holes on which said metal layer is formed.

2. A member with filled metal sections, according to claim 1, wherein said metal layer is formed on the inner surface of the end of each of said fine holes that opens in the outer surface of said workpiece and on the outer surface of said workpiece that extends around the end of each of said fine holes on which said metal layer is formed, and an external metal section, which is unitarily formed with said filled metal section, and has a padded form so as to protrude from the outer surface of said workpiece, is formed so as to cover said metal layer.

3. A member with filled metal sections, the filled metal sections formed by filling metal into fine holes formed in a workpiece; wherein a metal layer is formed on an inner surface of an end of each of said fine holes that opens to an outer surface of said workpiece, and a filled metal section is filled at a site that includes the end of each of said fine holes on which said metal layer is formed;

said metal layer is formed on the inner surface of the end of said fine hole that opens in the outer surface of said workpiece and on the outer surface of said workpiece that extends around the end of each of said fine holes on which said metal layer is formed, and an external metal section, which is unitarily and continuously formed with said filled metal section, and has a padded form so as to protrude from the outer surface of said workpiece, is formed so as to cover said metal layer.

* * * * *

UNITED STATES PATENT AND TRADEMARK OFFICE
CERTIFICATE OF CORRECTION

PATENT NO. : 6,743,499 B2
DATED : June 1, 2004
INVENTOR(S) : Suemasu et al.

It is certified that error appears in the above-identified patent and that said Letters Patent is hereby corrected as shown below:

Column 13,
Line 16, now reads "failing" should read -- falling --;

Column 18,
Line 31, now reads "boles" should read -- holes --.

Signed and Sealed this

Twenty-first Day of December, 2004

JON W. DUDAS
*Director of the United States Patent and Trademark Office*